(12) United States Patent
Custer et al.

(10) Patent No.: US 6,473,314 B1
(45) Date of Patent: Oct. 29, 2002

(54) RF POWER AMPLIFIER ASSEMBLY EMPLOYING MULTI-LAYER RF BLOCKING FILTER

(75) Inventors: James Keith Custer, Folsom; Pauline Mei-Seung Tong, Elk Grove, both of CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 10 days.

(21) Appl. No.: 09/632,151

(22) Filed: Aug. 3, 2000

(51) Int. Cl.[7] ............................. H05K 1/14; H05K 9/00; H03F 1/00
(52) U.S. Cl. .................. 361/818; 361/728; 361/736; 361/746; 361/750; 330/66; 330/67; 330/68
(58) Field of Search ................................ 361/728, 736, 361/800, 799, 816, 818, 734, 750, 746; 330/68, 66, 67; 257/728; 174/255, 261

(56) References Cited

U.S. PATENT DOCUMENTS

| | | |
|---|---|---|
| 4,622,526 A | 11/1986 | Schneider et al. |
| 4,714,905 A | 12/1987 | Bernstein et al. |
| 4,908,586 A | 3/1990 | Kling et al. |
| 4,954,929 A | 9/1990 | Baran |
| 5,017,164 A | 5/1991 | Gibbs |
| 5,165,055 A | 11/1992 | Metsler |
| 5,268,810 A | 12/1993 | DiMarco et al. |
| 5,281,166 A | 1/1994 | Yu et al. |
| 5,387,888 A * | 2/1995 | Eda et al. .................... 257/664 |
| 5,424,492 A | 6/1995 | Petty et al. |
| 5,451,158 A | 9/1995 | Lin et al. |
| 5,488,540 A | 1/1996 | Hatta |
| 5,493,259 A | 2/1996 | Blalock et al. |
| 5,532,656 A | 7/1996 | Yoshimura |
| 5,571,608 A | 11/1996 | Swamy |
| 5,607,313 A | 3/1997 | Nyman |
| 5,717,249 A * | 2/1998 | Yoshikawa et al. ......... 257/532 |
| 5,959,829 A | 9/1999 | Stevenson et al. |

* cited by examiner

*Primary Examiner*—Jayprakash N Gandhi
(74) *Attorney, Agent, or Firm*—Myers, Dawes & Andras LLP (57) ABSTRACT

A low cost radio frequency interference filter assembly comprises a multiple layer structure including a middle trace layer disposed between an upper ground layer and lower ground layer. Non-conductive insulation layers are disposed between the middle trace layer and the upper and lower ground layers. The upper layer includes input contacts, signal contacts, and capacitors which are coupled to the signal contacts and an upper grounded substrate. The middle trace layer includes a grounded substrate and trace lines which are coupled to the signal contacts of the upper layer by signal vias. The lower layer includes a grounded substrate. Ground vias are formed through the insulation layers to couple the middle grounded substrate to the upper and lower grounded substrates. The filter assembly may be formed as an integral projection of a printed circuit board assembly. A structure for an RF power amplifier assembly is provided along with methods for manufacturing a filter assembly and assembling an electronics assembly.

17 Claims, 5 Drawing Sheets

RF POWER AMPLIFIER ASSEMBLY EMPLOYING MULTI-LAYER RF BLOCKING FILTER

BACKGROUND OF THE INVENTION

1. Field of the Invention

The present invention relates generally to a radio frequency interference (RFI) filter. More particularly, the present invention relates to an RFI filter feed-through assembly which may be incorporated in an RF power amplifier.

2. Description of Related Art

Modern wireless communication base stations transmit and receive radio frequency ("RF") signals through the use of RF power amplifiers. Within the amplifier assemblies are typically plural printed circuit ("PC") boards on which components that process the RF signals are mounted. RF signals must be transmitted between the various processing components. These intra-device transmissions may be accomplished through the use of microstrip technology, such as coplanar waveguides.

Other direct current ("DC") or low-frequency signals may coexist with the high frequency signals in the amplifier assembly. For some applications, it is necessary to isolate a PC board or a region of a PC board from interference by outside RF signals or intra-device RF signals, while at the same time providing for the communication of DC or low-frequency signals. For example, modern RF power amplifiers typically have control systems which provide monitoring and control through use of microprocessors and/or other control integrated circuits ("ICs"). Therefore, the DC signal may be the control output of an IC.

Isolation from RF signals propagating through different sections of an assembly may be provided by a metal enclosure or shield. For instance, referring to FIGS. 1A and 1B (top plan view) which show a conventional construction of an RFI filter, one might may isolate two PC boards 71, 72 by placing them on opposite sides of a grounded metal barrier wall or bulkhead 4 within the assembly. The metal bulkhead 4 separates two regions 61, 62 lying on opposite sides thereof and shields electromagnetic radiation from being transmitted between the regions 61, 62. Communication of DC signals between the boards 71, 72 can be provided by an insulated conductive feed-through 3 which passes through the bulkhead 4. The feed-throughs 3 are mounted through the bulkhead 4 so that the conductive input and output terminals 20a, 20b lie on opposite sides of the bulkhead 4. Attached via ribbon cables 1 near the edges of the two PC boards 71,72 are connectors 2 which are adapted to mate with the conductive terminals 20a, 20b of the feed-through 3. However, this configuration provides only incomplete isolation because RF signals may still propagate along the feed-through 3.

Figure 2A:
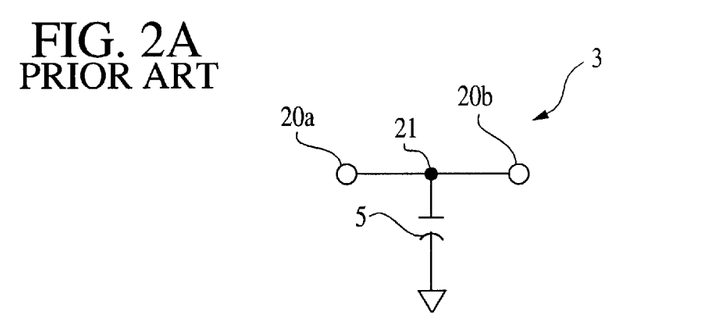
FIG. 2A is a circuit diagram for a prior art low-pass filter arrangement.

To prevent such RF propagation, it is conventional to incorporate an RFI filter in the conductive feed-through 3. In FIG. 2A, a circuit diagram for one embodiment of a. conventional filter is shown. Lying between an input terminal 20a and output terminal 20b of the filter 3 is a node 21. Attached to the node 21 is a grounded shunt capacitor 5. In the normal operation of the filter 3 an input signal containing high frequency (about 0.9 MHz and above) and low frequency components (about 50 kHz and below) is introduced at the input terminal 20a. The shunt capacitor 5 acts as a low-pass filter, providing a path to ground for undesirable co-propagating RF signals while allowing DC or low frequency signals to pass through the bulkhead 4. Thus, the output signal presented at the output terminal 20b primarily consists of the low frequency components of the input signal.

Figure 2B:
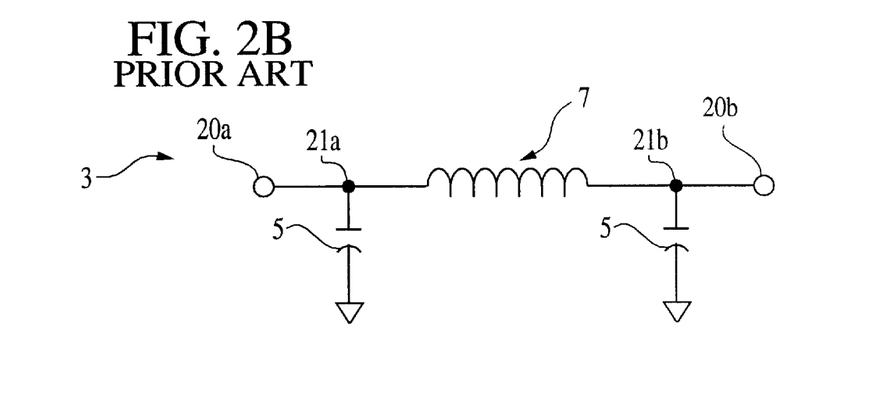
FIG. 2B is a circuit diagram for a prior art low-pass filter arrangement.

Another variation of an RFI filter is the Pi filter, illustrated in FIG. 2B. Lying in series between the input terminal 20a and output terminal 20b of the feed-through 3 is an inductor 7. On opposite ends of the inductor 7 are nodes 21a, 21b. Attached at the nodes 21a, 21b are grounded shunt capacitors 5. In the normal operation of the filter 3, an input signal containing high frequency and low frequency components is introduced at the input terminal 20a. The shunt capacitors 5 provide a path to ground which substantially attenuates the high frequency components of the input signal. Moreover, the inductor 7 presents a high impedance to high frequency components and provides additional attenuation of the high frequency components. Thus, the output signal presented at the output terminal 20b primarily consists of the low frequency components of the input signal. The feed-through filters described in FIGS. 2A and 2B provide bi-directional filtering of high frequency components, i.e. an input signal may be alternatively introduced at the output.

Figure 1A:
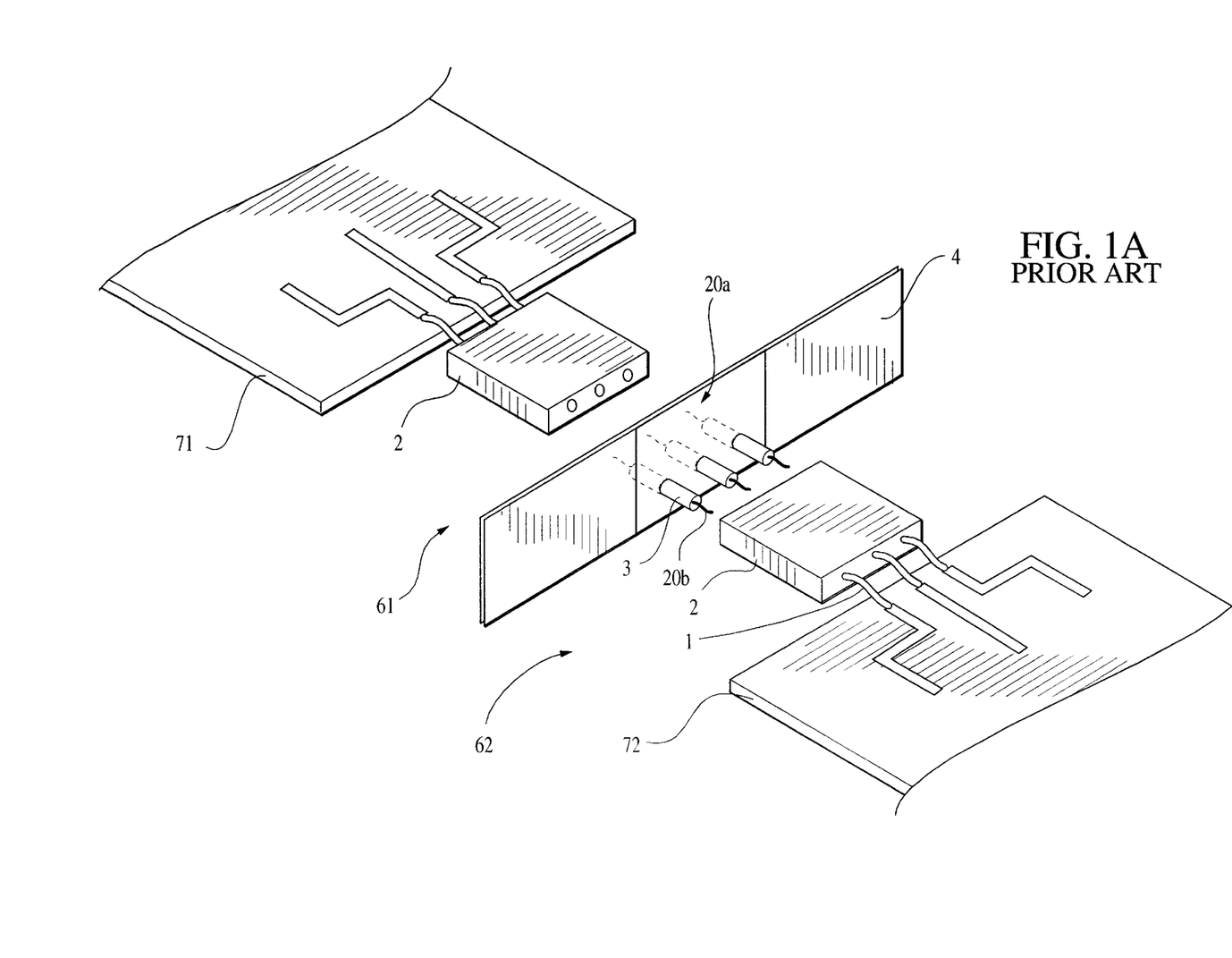
FIG. 1A is a perspective view of an RF assembly incorporating a prior art feed-through configuration.
Figure 1B:
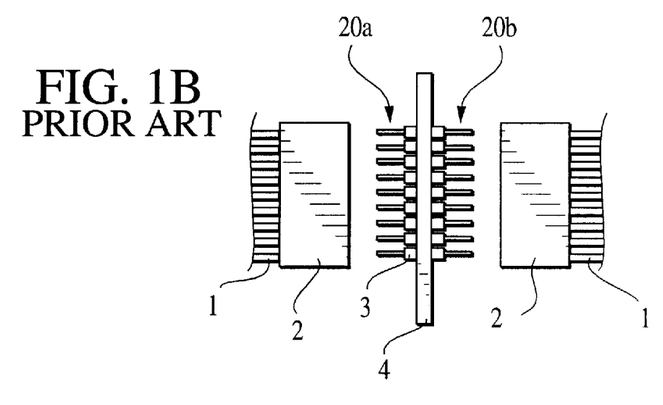
FIG. 1B is a top plan view of the prior art feed-through configuration.

A drawback to conventional feed-through RFI filters is that their use entails added cost. First, the feed-through component 3 itself is costly. Moreover, since the conductive leads 20a, 20b of the feed-through component 3 are usually not directly coupled to the PC boards 71, 72 on either side of the bulkhead 4, the PC boards 71, 72 must somehow be joined to the conductive leads 20a, 20b of the feed-through 3. As shown in FIGS. IA and 1B, this is conventionally done by attaching to each PC board 71, 72 a connector 2 which mates with the feed-through leads 20a, 20b and connects to PC board leads 1. The use of a separate connector adds to the manufacturing cost of an RF assembly, and may increase the labor cost if the connector on the PC board must be manually mated with the leads of the feed-through component. Also, the feed-through components and separate connectors conventionally used are bulky.

Accordingly, a need presently exists for effective prevention of RF interference between sections of an RF assembly that is less expensive than prior art solutions.

SUMMARY OF THE INVENTION

An RFI filter assembly is provided which overcomes the deficiencies of the prior art.

In one aspect, a low cost RFI filter assembly is provided which comprises a multi-layered printed circuit board assembly. In a preferred embodiment, the layered PC board assembly is adapted to pass below or through a shield bulkhead, or partition, for conducting DC or low frequency signals through the shield bulkhead. In a preferred embodiment, three conductive layers are provided, separated by non-conductive insulation layers. A top layer includes a conductive ground plane. A middle trace layer of the three-layered embodiment comprises several narrow conductive paths that traverse the length of the board surrounded by grounded regions. The narrow conductive paths function as an inductor which resists the propagation of high-frequency signals from one end of the board to the other. A bottom layer of the three-layered embodiment comprises a ground plane. The grounded regions of all three layers are electrically coupled by plated ground via holes through all three layers.

In a further aspect of the invention, affixed to the ground plane are two groups of capacitive elements spaced across the width of the top ground plane on opposite sides of the bulkhead. Each of the capacitive elements comprises two conductive contacts One contact of each capacitive element in the first group is electrically coupled to the top ground plane while the other contact is electrically coupled to a respective conductive path traversing the middle trace layer of the board assembly. The second group of capacitive elements is similarly coupled at the opposite end of the board. The capacitive elements provide a shunt path for high-frequency signals to ground, and thus attenuate high-frequency signals introduced at the extreme ends of the conductive paths.

This configuration functions as a Pi filter providing effective filtering of RF signals without the use of bulky feed-through components. Also, ground layers may be provided on the sides of the narrow conductive paths. These prevent RF radiation propagating through the assembly. Therefore, RF interference between shielded regions is effectively blocked.

The invention, now having been briefly summarized, may be better appreciated by the following detailed description.

DETAILED DESCRIPTION OF THE PREFERRED EMBODIMENTS

The invention and its various embodiments can now be better understood by turning to the following detailed description wherein illustrated embodiments are described. It is to be expressly understood that the illustrated embodiments are set forth as examples and not by way of limitations on the invention as ultimately defined in the claims.

Figure 3:
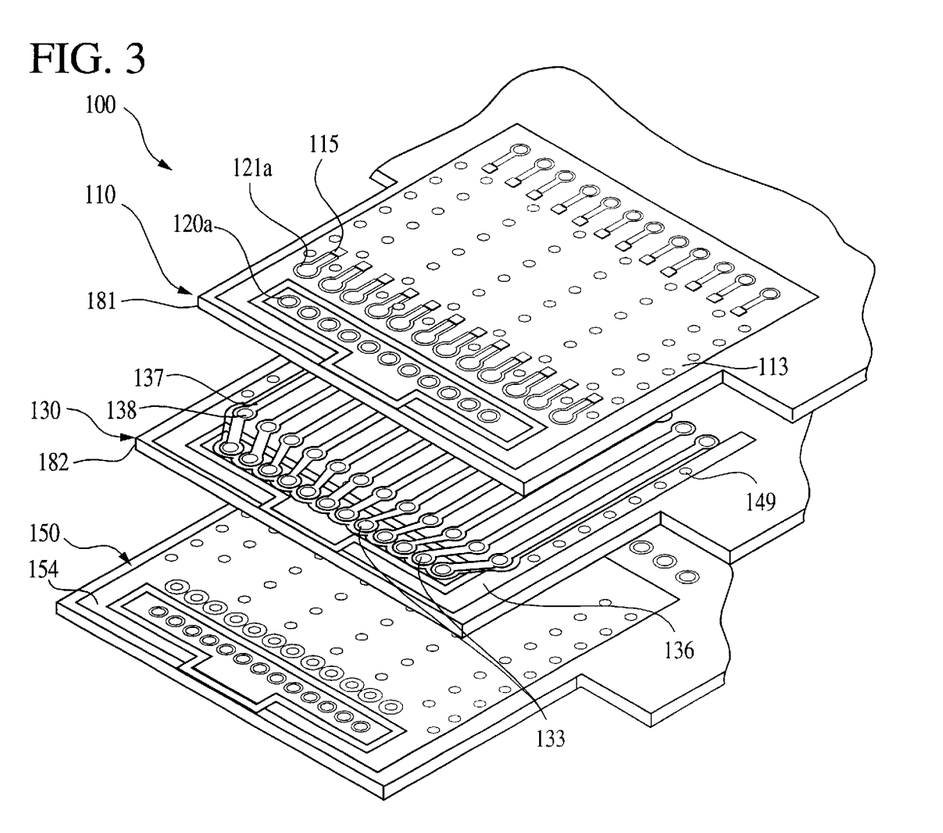
FIG. 3 is an exploded perspective view of an RF filter assembly incorporating a three-layer circuit board filter according to a preferred embodiment of the present invention.

FIG. 3 is a perspective view of an embodiment of an RF filter assembly according to the present invention. In a preferred embodiment, the RF filter assembly 100 is incorporated in a multi-layer PC board assembly. In particular, the filter assembly 100 may be formed as a projection extending integrally from a printed circuit board assembly in an RF power amplifier, such as an amplifier module or a control circuit module. Thus, an electronics module assembly which includes a printed circuit board, such as an amplifier module or a control circuit module, may be formed according to the invention by providing multiple layers with an integral projection containing the filter elements as described below.

In the preferred embodiment of FIG. 3, three conductive planar layers 110, 130, 150 are shown. More specifically, the top layer 110 may comprise a thin conductive layer on an insulating portion, or support, 181, composed of, for example, any known non-conductive insulating materials conventionally used in the construction of PC boards. Alternatively, the upper insulating portion 181 may comprise a structure separate from the conductive layer 110 which is then mounted thereon. Similarly, the middle layer 130 may comprise a conductive layer formed on an insulation layer 182 while the bottom layer 150 may also comprise an optional insulation layer. The top ground layer 110 comprises a ground plane 113 with RF interference filter elements 115a, 115b mounted thereon, which in a preferred embodiment are capacitors. The ground plane 113 may be formed by providing a thin conductive layer, e.g. of copper, on insulating support 181 and etching or otherwise removing regions to form a desired pattern. Alternatively, a patterned conductive layer may be formed using a mask. The top layer 110 also includes input terminals, or input contacts, 120a and optional signal leads 121a which are insulated from the ground plane 113. It is to be expressly understood that the input contacts 120a and RF. interference elements need not be disposed on the top layer 110. The middle layer 130 is sandwiched between the upper ground layer 110 and the lower layer 150. The middle layer 130 comprises a ground plane 136 and several internal signal traces 137 insulated from the ground plane 136. The middle layer 130 may be formed as a thin conductive layer on the insulating support 182 using etching or masking as in the case of the upper layer 110. Disposed beneath the middle layer 130, the bottom ground layer 150 comprises a ground plane 154.

Figure 4:
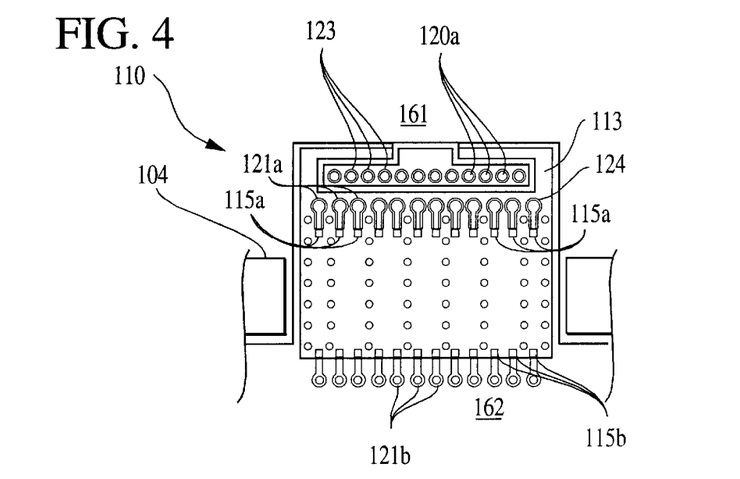
FIG. 4 is a top plan view of the top layer of the three-layer circuit board filter.
Figure 7:
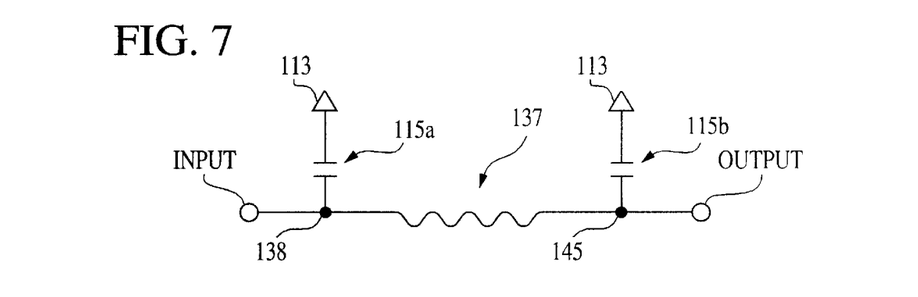
FIG. 7 is a circuit diagram of the filter assembly according to the invention.

In FIG. 4, an array of conductive input terminals 120a disposed adjacent to one edge of the top layer 110 may act as input terminals for multiple input signals. For example, input signals may comprise DC power supply lines, low frequency control signals, and monitoring or feedback signals. The input terminals 120a are electrically isolated from the ground plane 113 by a surrounding insulation region 123 which is formed by removing a ring of conductive material from around the input terminals 120a. Disposed near the input terminals 120a are capacitive elements, or capacitors, 115a, 115b. Each capacitor 115a, 115b has two conductive contacts, as shown in FIG. 7. One conductive contact is electrically coupled to the ground plane 113. The other contact is electrically coupled to a signal lead 121a. Since the signal lead 121a is optional, the capacitor 115a may be electrically connected to the input 120a. Furthermore, it is to expressly understood that the capacitors 115a, 115b may be electrically coupled to the ground plane of any other layer. The signal leads 121a are electrically isolated from the ground plane 113 by a surrounding insulation region 124 A second set of capacitors 115b is spaced away from the first set of capacitors 115a at a distance that will place them on the opposite side of the bulkhead 104 when the filer assembly 100 is installed for operation. Each capacitor 115b in the second set has two conductive contacts, as shown in FIG. 7. One conductive contact 125 is electrically coupled to the ground plane 113. The other contact is electrically coupled to one of a second set of signal leads 121b. The capacitors 115a, 115b may comprise the surface mount variety, thus allowing for the mounting of the capacitors 115a, 115b on the top layer 110 as circuit traces extend into the PC board assembly using conventional surface mount technology. The first and second set of signal leads 121a, 121b are electrically coupled by shunt via holes to the internal signal traces described below in connection with FIGS. 5A and 5B.

Figure 5A:
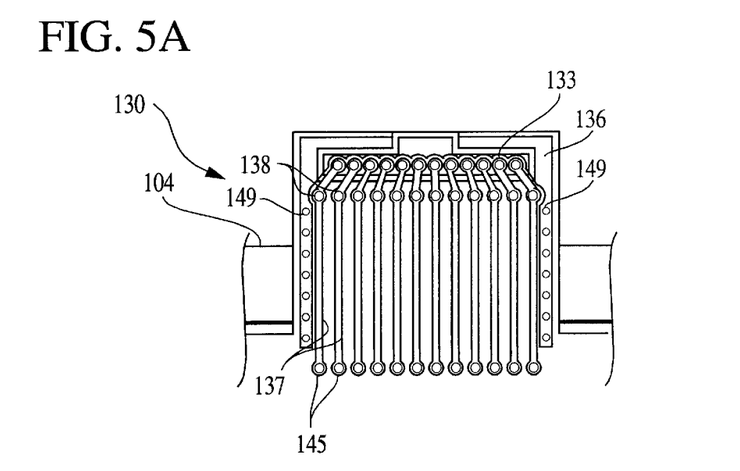
FIG. 5A is a top plan view of the middle layer of the three-layer circuit board filter.

Referring now to FIG. 5A, the details of the middle layer 130 of the filter 100 will be described. Traversing the length of the middle layer 130 are internal signal traces 137 formed from an electrically conductive material. Adjacent to the extremities, each internal signal trace 137 is electrically coupled to shunt via holes 138,145 plated with an electrically conductive material. As described above, the shunt via holes 138, 145 are also electrically coupled to the top layer 110 of the filter assembly 100. Each internal signal trace 137 may be electrically coupled to optional input via holes 133 near a board edge. The optional input via holes 133 may be plated with an electrically conductive material and electrically coupled to the conductive input terminals 120a described above. Encompassing the internal signal traces 137 is a middle ground plane 136. The middle ground plane 136 is electrically coupled to the top ground plane 113 and the bottom ground plane 154 by way of ground via holes 149 plated with an electrically conductive material.

Figure 5B:
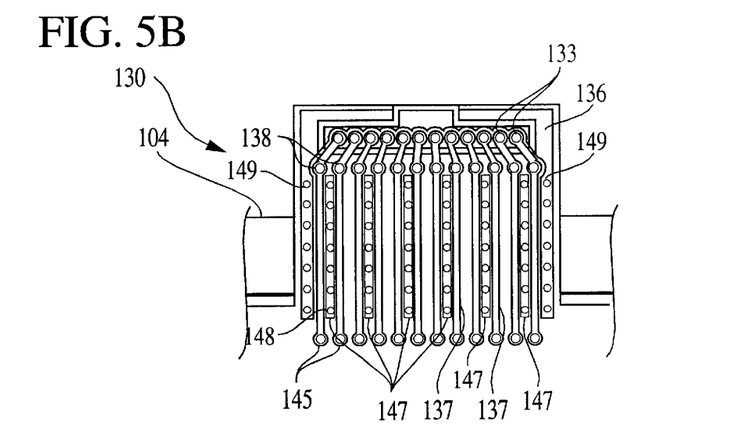
FIG. 5B is a top plan view of an alternative embodiment of the middle layer of a three-layer circuit board filter.

As depicted in FIG. 5B, additional RF shielding may be achieved by forming interstitial ground strips 147 between pairs of internal signal traces 137. These strips may be desired when very high frequencies are present in the RF assembly, or where harmonics are present which need to be blocked. The interstitial ground strips 147 are electrically coupled to the top ground plane 113 and the bottom ground plane 154 by way of ground via holes 148 plated with an electrically conductive material. The spacing between the interstitial ground strips may be chosen to block propagation of the frequency of RF energy generated in the modules. In particular, the spacing between strips 147 should be less than λ/2 where A is the wavelength propagating in the module. For example, for RF frequencies up to 2 GHz, ground strip spacings will be less than 2.84 inches. The dielectric constant of the board material will affect this dimension and spacings of less than about 1.5 inches may be required depending on the material. Also, harmonics may propagate through spacings blocking the main frequency and spacings between strips 147 of about 0.2 inches or less may be employed to block harmonics.

Figure 6:
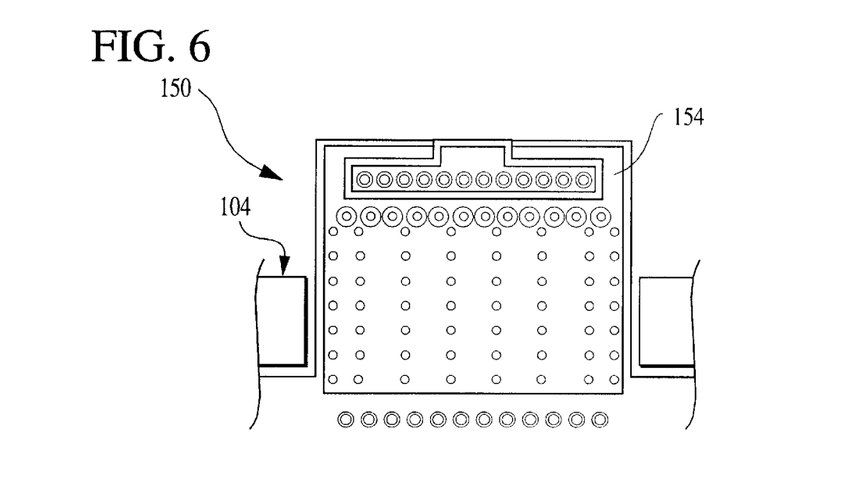
FIG. 6 is a top plan view of the bottom layer of the three-layer circuit board filter.

FIG. 6 is a top plan view of the bottom layer 150 of the filter. The bottom layer 150 comprises a ground plane 154 which is electrically coupled to the top ground plane 113 and the middle ground plane 136 by way of ground via holes plated with an electrically conductive material. The bottom layer 150 is substantially similar in structure to the top layer 110 except that the bottom layer 150 is inverted such that the bottom surface of the top layer (not shown) is similar to the top surface of the bottom layer 150 shown in FIG. 6. Accordingly, the bottom surface of the bottom layer (not shown) is similar to the top surface of the top layer 110 shown in FIG. 4. The bottom layer 150 may also comprise an insulation support.

In practice, the top and bottom ground planes 113, 154, respectively, may also be in electrical contact with the shield bulkhead 104 such that the ground planes 113, 154 are held at the same potential as shield bulkhead 104. The internal, or middle, ground plane 136 and interstitial ground traces 137 would also be held at the same potential as the shield bulkhead 104 due to their electrical connection to the top and bottom ground planes 113, 154 by way of the ground via holes.

A filter constructed according to the invention electrically functions as a Pi filter, such as described in connection with FIG. 2B. As will be appreciated by those skilled in the art, narrow conductive strips such as the internal signal traces 137 in FIGS. 5A and 5B have inductive qualities which vary according to their length, width, and thickness. The internal signal traces 137 thus correspond to the inductive element 7 in FIG. 2B. Moreover, the internal signal traces 137 in FIGS. 5A and 5B are coupled by way of shunt via holes and signal leads 121a and 121b to one lead of each capacitor 115a, 115b mounted on the top layer 110 of the filter assembly 100. The other lead of each capacitor 115a, 115b is coupled to the top ground plane 113.

Thus, the filter assembly 100 acts as a low-pass filter of a signal introduced at input terminals 120a. In FIG. 7, high frequency components of an input signal are attenuated by the capacitors 115a, 115b which provide a path to ground 113. Moreover, the internal signal traces 137, due to the impedance generated by their inductive qualities, resist the propagation of the RF components of an input signal. In contrast, low frequency and DC components of an input signal propagate with little resistance along the internal signal traces 137, and thus can pass between the two regions 161, 162 lying on either side of the shield bulkhead 104, as shown in FIG. 4.

Figure 8:
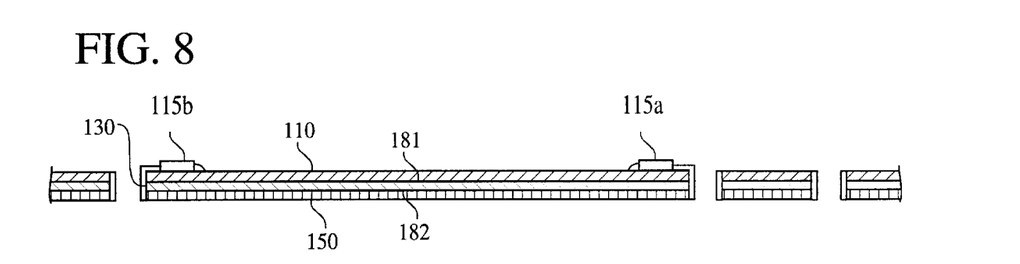
FIG. 8 is a side elevation view of the filter assembly.

FIG. 8 is a cross-sectional view of the filter assembly 100 of FIG. 3. It will be appreciated that the inductive trace lines are disposed on the middle layer 130 which is sandwiched between the upper ground layer 110 and the lower ground layer 150. It will further be appreciated that the capacitors 115a, 115b are disposed on a different layer than that of the trace lines. As indicated by the break lines, the filter assembly 100 may be formed as an integral projection of a printed circuit board assembly fabricated according to the invention.

It will be appreciated that the invention provides a low cost, compact filter assembly that offers improved performance over the prior art.

Figure 9:
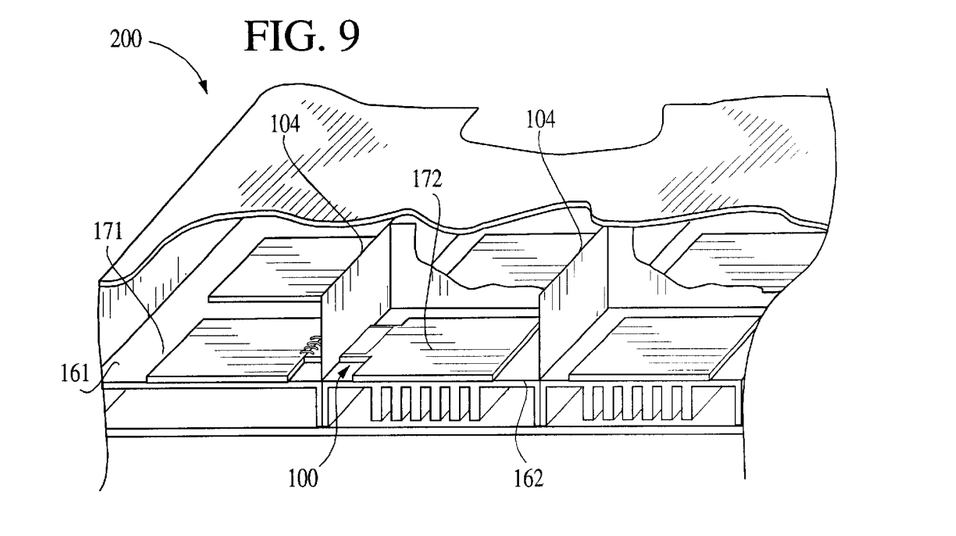
FIG. 9 is a perspective view of an RF power amplifier assembly having RF shielded compartments according to the present invention.

FIG. 9 is a perspective view of an RF power amplifier assembly 200, such as an amplifier in a cellular base station, incorporating a printed circuit board assembly, or electronics module assembly, 172 having a filter 100 according to the invention. The electronics module assembly 172 may comprise, for example, an amplifier module or control circuit module formed with multiple layers. The multi-layered module 172 formed according to the invention includes an integral filter assembly 100 that extends toward another electronics module assembly, such as control circuit 171, disposed in a separate region separated by the bulkhead, or partition, 104. The modules 171, 172 may incorporate RF amplifier circuitry and control circuitry such as described in U.S. Pat. No. 5,796,304 to Gentzler, the disclosure of which is incorporated herein by reference. Since the filter assembly 100 may be formed as an integral projection of an electronics module 172, the filter assembly 100 needs to be connected only once on the other side 162 of the bulkhead 104 as opposed to prior art feed-throughs which need to be twice connected to PC boards on both sides of a partition. Thus, the present invention not only saves labor costs but dispenses with the bulky, costly connectors 2 of the prior art, as shown in FIG. 1A. Unlike the assembly process for prior art feed-throughs which are not automated, the present invention also provides filters which can be manufactured and assembled in an automated process, thus further saving labor costs. The filter assembly 100 according to the present invention also provides greater performance by more effectively filtering out undesired signals through its multi-layered structure.

Many alterations and modifications may be made by those having ordinary skill in the art without departing from the spirit and scope of the invention. For example, though the optional interstitial ground traces 147 in FIG. 5B are shown separating pairs of internal signal traces 137, they could alternatively be formed between each internal signal trace 137 in an alternating pattern. Therefore, it must be understood that the illustrated embodiments have been set forth only for the purposes of examples and that they should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification the generic structure, material or acts of which they represent a single species.

The definitions of the words or elements of the following claims are, therefore, defined in this specification to not only include the combination of elements which are literally set forth. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what incorporates the essential idea of the invention.

What is claimed is:

1. An RF power amplifier assembly, comprising:
    a housing;
    an RF shield partition dividing the housing, at least in part, into a first region and second region;
    a first electronics module disposed in the first region of the housing;
    a second electronics module disposed in the second region of the housing; and
    a multi-layered filter assembly electrically coupling the first electronics module to the second electronics module so as to pass DC and low frequency signals and block RF signals, the multi-layered filter assembly comprising:
        an input contact electrically coupled to the first electronics module;
        an RF interference filter element electrically coupled to the input contact; and
        a signal trace electrically coupled to the RF interference filter element.

2. The amplifier assembly of claim 1, wherein the multi-layered filter assembly comprises:
    a first ground layer comprising a first ground plane, the input contact, the RF interference filter element; and
    a trace layer comprising the signal trace.

3. The amplifier assembly of claim 2, wherein the multi-layered filter assembly further comprises a second ground layer having a second ground plane, and wherein the trace layer is disposed between the first ground layer and the second ground layer.

4. The amplifier assembly of claim 3, wherein the trace layer comprises a third ground plane.

5. The amplifier assembly of claim 4, further comprising:
    a first ground via formed through the first ground layer, the first ground via electrically coupling the first ground plane to the third ground plane and
    a second ground via formed through the second ground layer, the second ground via electrically coupling the third ground plane to the second ground plane.

6. The amplifier assembly of claim 1, wherein the RF interference filter element comprises a capacitor.

7. The amplifier assembly of claim 1, wherein the filter assembly is integral with the first electronics module.

8. The amplifier assembly of claim 7, wherein the first module comprises a multi-layered printed circuit board assembly.

9. An RF power amplifier assembly, comprising:
    a housing;
    an RF shield partition dividing the housing, at least in part, into a first region and second region;
    an RF electronics module comprising RF amplifier circuitry disposed in the first region of the housing and generating RF signals;
    a control electronics module comprising amplifier control circuitry disposed in the second region of the housing and providing low frequency signals; and
    a connector, having a first contact electrically coupled to the control electronics module and a second contact electrically coupled to the RF electronics module, said connector including an electrical path between the contacts electrically coupling the low frequency signals from the control electronics module to the RF electronics module, the connector having a multi-layered structure configured and dimensioned so as to block transmission of the RF signals through the connector structure, the multi-layered connector further comprising an RF blocking filter element electrically coupled to the electrical path to block transmission of the RF signals between the first and second contacts.

10. An RF power amplifier assembly as set out in claim 9, wherein said RF module or said control module comprises a multi-layer assembly integrated with said multi-layer connector.

11. An RF power amplifier assembly as set out in claim 9, wherein said electrical path comprises a plurality of parallel signal lines.

12. An RF power amplifier assembly as set out in claim 9, wherein said multi-layered connector structure comprises at least three layers.

13. An RF power amplifier assembly as set out in claim 9, wherein said at least three layers comprise an upper ground plane layer, a lower ground plane layer, and a middle layer comprising said electrical path.

14. A method for assembling an electronics assembly, the method comprising:
    providing a first multi-layered electronics module having a multi-layered filter assembly that includes an input, an RF interference filter element, a ground plane and a trace line;

disposing the multi-layered electronics module in a first region of a housing;

disposing a second electronics module in a second region of the housing;

separating the first region and the second region with a bulkhead; and coupling the second electronics module to the filter assembly of the first multi-layered electronics module so as to pass DC and low frequency signals between the modules and block RF signals.

15. The method in claim 14, wherein providing a first multi-layered electronics module having a multi-layered filter assembly comprises forming the multi-layered filter assembly integrally with the first multi-layered electronics module.

16. The method in claim 14, wherein providing a first multi-layered electronics module having a multi-layered filter assembly comprises disposing a middle trace layer between an upper ground layer and a lower ground layer.

17. The method in claim 14, further comprising disposing the trace line on the middle trace layer.

* * * * *